US010325902B2

(12) United States Patent
Arai et al.

(10) Patent No.: US 10,325,902 B2
(45) Date of Patent: Jun. 18, 2019

(54) POWER TRANSISTOR WITH A PLURALITY OF BI-DIRECTIONAL DIODES

(71) Applicant: KABUSHIKI KAISHA TOSHIBA, Tokyo (JP)

(72) Inventors: Ryuta Arai, Himeji Hyogo (JP); Hidetoshi Asahara, Ibo Hyogo (JP); Makoto Tsuzuki, Ibo Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 240 days.

(21) Appl. No.: 15/247,541

(22) Filed: Aug. 25, 2016

(65) Prior Publication Data

US 2017/0263598 A1    Sep. 14, 2017

(30) Foreign Application Priority Data

Mar. 8, 2016   (JP) ................................. 2016-044000

(51) Int. Cl.
*H01L 29/66* (2006.01)
*H01L 21/332* (2006.01)
(Continued)

(52) U.S. Cl.
CPC ...... *H01L 27/0255* (2013.01); *H01L 27/0629* (2013.01); *H01L 28/24* (2013.01);
(Continued)

(58) Field of Classification Search
CPC . H01L 27/0255; H01L 27/0629; H01L 28/24; H01L 29/1095; H01L 29/7802; H01L 29/87; H01L 29/861
See application file for complete search history.

(56) References Cited

U.S. PATENT DOCUMENTS 5,502,338 A * 3/1996 Suda .................... H01L 27/0825
123/651
6,495,863 B2   12/2002 Narazaki
(Continued)

FOREIGN PATENT DOCUMENTS

JP  H07-147387 A   6/1995
JP  2012-109590 A  6/2012
JP  2014-013796 A  1/2014

OTHER PUBLICATIONS

Japanese Office Action dated Jul. 3, 2018, filed in counterpart Japanese Patent Application No. 2016-044000 (7 pages) (with machine translation).

*Primary Examiner* — Alonzo Chambliss
(74) *Attorney, Agent, or Firm* — Kim & Stewart LLP

(57) ABSTRACT

A semiconductor device includes a first bidirectional diode of a ring shape surrounding a central region and including a first connection section and a second connection section which is provided to the inner side of the ring shape from the first connection section, a semiconductor element in the central region including a first semiconductor element electrode, a second semiconductor element electrode, and a control electrode, the first semiconductor element electrode electrically connected to the first connection section and the second semiconductor element electrode electrically connected to the control electrode, a first resistor including a first resistor electrode and a second resistor electrode, the first resistor electrode electrically connected to the second connection section and the control electrode, a second bidirectional diode electrically connected to the second resistor electrode and to the second semiconductor element electrode, and a second resistor element electrically connected to the second resistor electrode.

11 Claims, 4 Drawing Sheets

(51) Int. Cl.
   *H01L 27/02*  (2006.01)
   *H01L 27/06*  (2006.01)
   *H01L 49/02*  (2006.01)
   *H01L 29/10*  (2006.01)
   *H01L 29/78*  (2006.01)
   *H01L 29/87*  (2006.01)

(52) U.S. Cl.
   CPC ...... *H01L 29/1095* (2013.01); *H01L 29/7802* (2013.01); *H01L 29/7803* (2013.01); *H01L 29/7808* (2013.01); *H01L 29/87* (2013.01)

(56) References Cited

U.S. PATENT DOCUMENTS

| | | |
|---|---|---|
| 6,965,150 B2 | 11/2005 | Higashida et al. |
| 8,183,606 B2* | 5/2012 | Arai .................... H01L 27/0255 |
| | | 257/262 |
| 8,581,356 B2* | 11/2013 | Pennock .............. H01L 29/861 |
| | | 257/415 |
| 9,142,463 B2 | 9/2015 | Harada et al. |
| 2006/0065925 A1* | 3/2006 | Yoshida .............. H01L 29/7813 |
| | | 257/329 |
| 2013/0256746 A1 | 10/2013 | Nakamura et al. |

\* cited by examiner

POWER TRANSISTOR WITH A PLURALITY OF BI-DIRECTIONAL DIODES

CROSS-REFERENCE TO RELATED APPLICATION

This application is based upon and claims the benefit of priority from Japanese Patent Application No. 2016-044000, filed Mar. 8, 2016, the entire contents of which are incorporated herein by reference.

FIELD

Embodiments described herein relate generally to a semiconductor device.

BACKGROUND

In a power Metal-Oxide-Semiconductor Field-Effect Transistor (MOSEFET) which is used to drive a mechanical relay or the like, an inductive load, such as a mechanical relay coil, is directly connected to the drain of the MOSFET. Therefore, it is desired to protect the MOSFET from a surge voltage and avalanche breakdown.

Various circuits have been used in order to protect the MOSFET.

DETAILED DESCRIPTION

Figure 1:
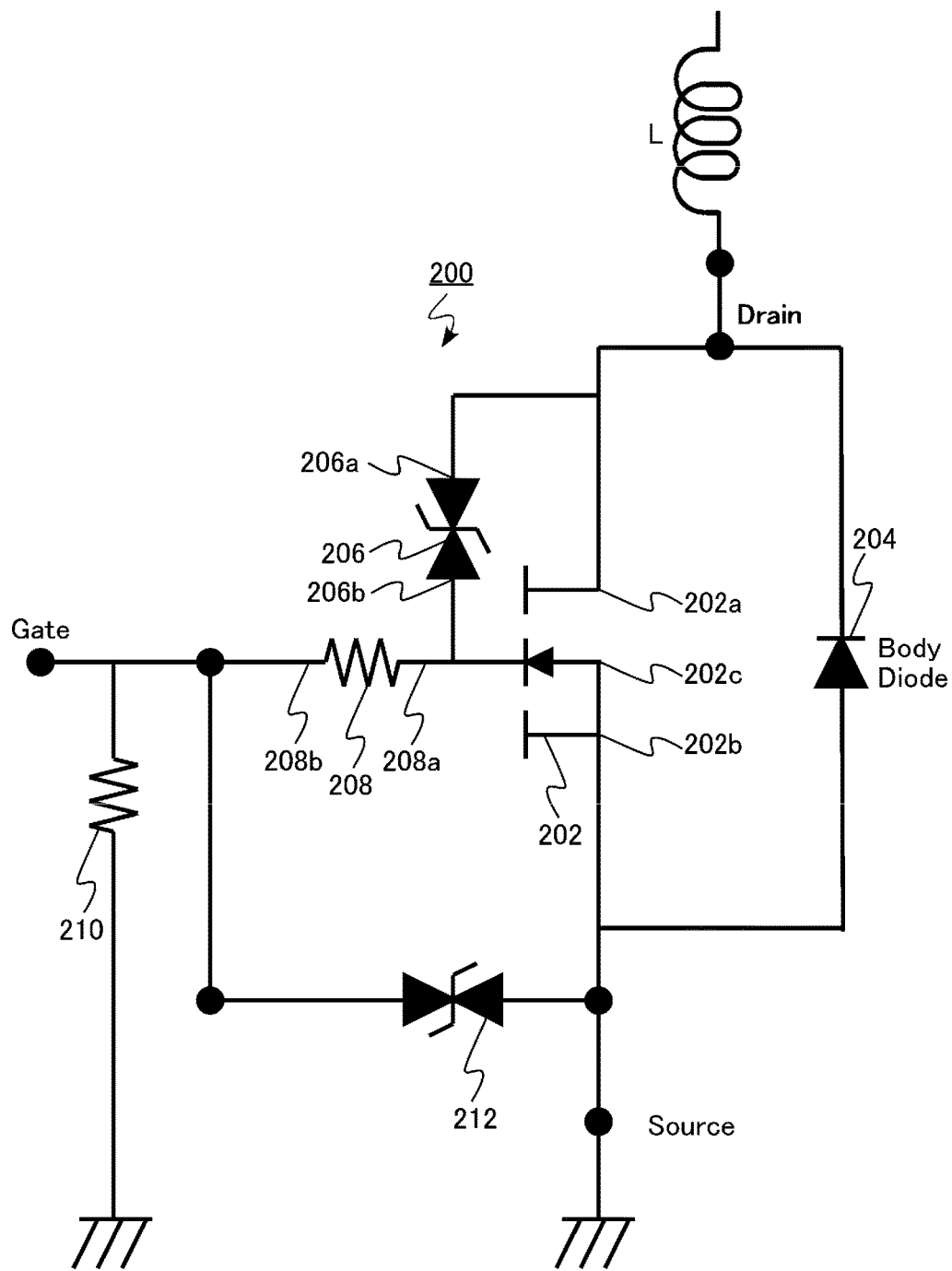
FIG. 1 is a schematic diagram illustrating an electric circuit which includes a semiconductor device according to an embodiment.

According to an embodiment, there is provided a semiconductor device which has a reduced size.

In general, according to one embodiment, there is provided a semiconductor device including: a first bidirectional diode of a ring shape surrounding a central region and including a first connection section and a second connection section which is provided to the inner side of the ring shape from the first connection section, a semiconductor element in the central region including a first semiconductor element electrode, a second semiconductor element electrode, and a control electrode, the first semiconductor element electrode electrically connected to the first connection section and the second semiconductor element electrode electrically connected to the control electrode, a first resistor including a first resistor electrode and a second resistor electrode, the first resistor electrode electrically connected to the second connection section and the control electrode, a second bidirectional diode including a first side electrode electrically connected to the second resistor electrode and a second side electrode electrically connected to the second semiconductor element electrode, and a second resistor element electrically connected to the second resistor electrode.

Hereinafter, an embodiment of this disclosure will be described with reference to the accompanying drawings.

In the disclosure, the same reference numerals are attached to the same or similar members, and there is a case in which the description thereof will not be repeated.

In the disclosure, in order to express the positional relationship between components, the upward direction of the drawing is described as "up", and the downward direction of the drawing is described as "down". In the disclosure, the concepts of "up" and "down" do not necessarily correspond to terms which indicate the relationship to the direction of gravity.

(Embodiment)

A semiconductor device according to the embodiment includes: a first bidirectional diode that has a ring shape, and includes a first connection section and a second connection section which is provided on an inner side than the first connection section; a semiconductor element that is provided on an inner side of the ring shape and includes a first semiconductor element electrode, a second semiconductor element electrode, and a control electrode, the first semiconductor element electrode being electrically connected to the first connection section and the second semiconductor element electrode being electrically connected to the control electrode; a first resistor element that includes a first resistor electrode and a second resistor electrode, the first resistor electrode being electrically connected to the second connection section and the control electrode; a second bidirectional diode that includes one side electrode, which is electrically connected to the second resistor electrode, and another side electrode which is electrically connected to the second semiconductor element electrode; and a second resistor element that is electrically connected to the second resistor electrode.

FIG. 1 is a schematic diagram illustrating an electric circuit 200 which includes a semiconductor device 100 according to the embodiment.

The electric circuit 200 includes a semiconductor element 202, a first bidirectional diode 206, a second bidirectional diode 212, a first resistor element 208, and a second resistor element 210.

The semiconductor element 202 according to the embodiment is a MOSFET. Hereinafter, in the embodiment, the semiconductor element 202 is described as an n-type vertical MOSFET. The semiconductor element 202 includes a first semiconductor element electrode (drain electrode) 202a, a second semiconductor element electrode (source electrode) 202b, and a control electrode (gate electrode) 202c. The first semiconductor element electrode 202a is connected to an external electric circuit L which is provided on the outside of the electric circuit 200. Here, the external electric circuit L is, for example, an inductive load such as a coil of a mechanical relay. The second semiconductor element electrode 202b is connected to the ground. The body diode 204 is the body diode of the MOSFET. Meanwhile, the semiconductor element 202 may be a p-type MOSFET. In addition, the semiconductor element 202 may be an Insulated Gate Bipolar Transistor (IGBT) in which the first semiconductor element electrode 202a is a collector electrode, the second semiconductor element electrode 202b is an emitter electrode, and the control electrode 202c is agate electrode. In addition, the semiconductor element 202 may be a bipolar transistor.

The first bidirectional diode (inter-GD bidirectional diode) 206 is a diode in which, for example, a plurality of diodes are connected to be parallel or such that the polarities thereof are reversed from each other. When the counter electromotive force is generated in the external electric circuit L in such a way that the inductive load connected to the first semiconductor element electrode 202a is turned off, the first bidirectional diode 206 is in an energizing state, with the result that the gate voltage of the semiconductor element 202 increases, and thus the semiconductor element 202 goes into a turned-on state. Therefore, the increase in a drain-source voltage is suppressed, and thus it is possible to prevent the semiconductor element 202 from being destroyed. Meanwhile, the first bidirectional diode may include a zener diode in one direction, and a PN junction diode in a direction opposite to the above-described one direction.

The first bidirectional diode 206 includes a first connection section 206a and a second connection section 206b. The first connection section 206a is electrically connected to the first semiconductor element electrode 202a. The second connection section 206b is electrically connected to the control electrode 202c.

The first resistor element 208 is used as a gate series resistor. The first resistor element 208 includes a first resistor electrode 208a and a second resistor electrode 208b. The first resistor electrode 208a is electrically connected to the second connection section 206b and the control electrode 202c.

The second bidirectional diode 212 (inter-GS bidirectional diode) is a diode in which, for example, a plurality of diodes are connected to be parallel or such that the polarities thereof are reversed from each other. The second bidirectional diode 212 is an Electrostatic Discharge (ESD: static electricity) protection diode. One-side electrode of the second bidirectional diode 212 is electrically connected to the second semiconductor element electrode 202b. The other-side electrode of the second bidirectional diode 212 is electrically connected to, for example, the second resistor electrode 208b of the first resistor element 208. The other-side electrode of the second bidirectional diode 212 may be electrically connected to the first resistor electrode 208a of the first resistor element 208.

The second resistor element 210 is used as a pull-down resistor. The second resistor element 210 is connected to the first resistor element 208 and to ground.

The reverse voltage of the first bidirectional diode 206 is equal to or higher than an intrinsic withstand voltage VDSS of the semiconductor element 102 in order to protect the semiconductor element 202. The reverse voltage of the first bidirectional diode 206 is equal to or higher than, for example, the reverse voltage of the second bidirectional diode 212. The reverse voltage of the second bidirectional diode 212 is higher than a gate rating voltage of the semiconductor element 202 such that it is possible to clamp the operation of the semiconductor element 202 in a case in which the ESD is mixed. In addition, the reverse voltage of the second bidirectional diode 212 is lower than a gate film breakdown voltage of the semiconductor element 102 in order to prevent the semiconductor element 202 from being destroyed.

When the first bidirectional diode 206 is clamped, the gate voltage of the semiconductor element 202 increases. A voltage (gate voltage), which is applied to the control electrode 202c at this time, is stabilized to a voltage which is determined by the partial pressures of the first resistor element 208 and the second resistor element 210. Therefore, the suitable partial pressures should be determined by taking the switching speed or the like of the semiconductor element 202 into consideration. Generally, the resistance of the first resistor element 208 and the resistance of the second resistor element 210 are selected such that the resistance of the second resistor element 210 is larger than the resistance of the first resistor element 208.

Figure 2:
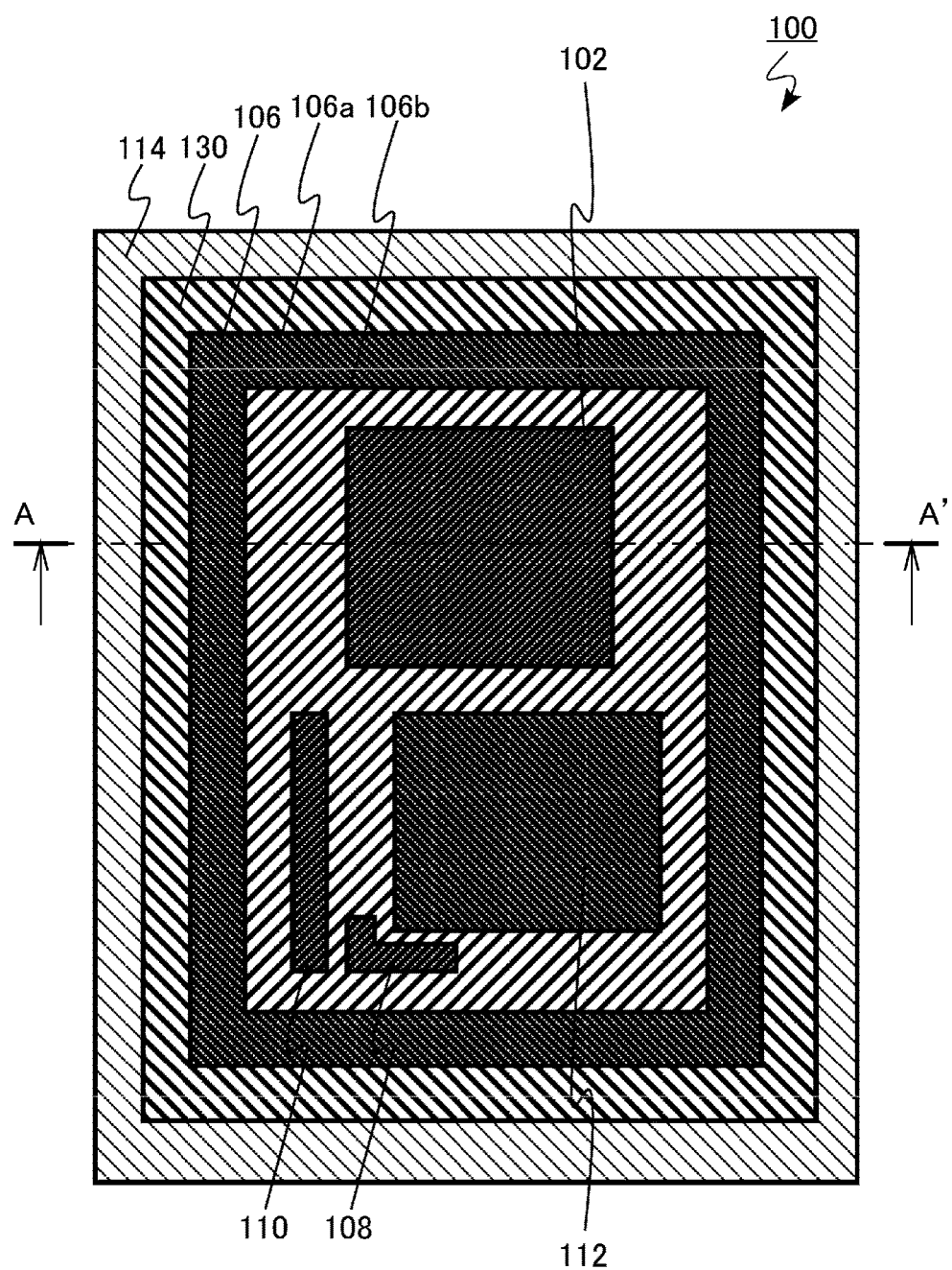
FIG. 2 is a schematic diagram illustrating the semiconductor device according to the embodiment.
Figure 3A:
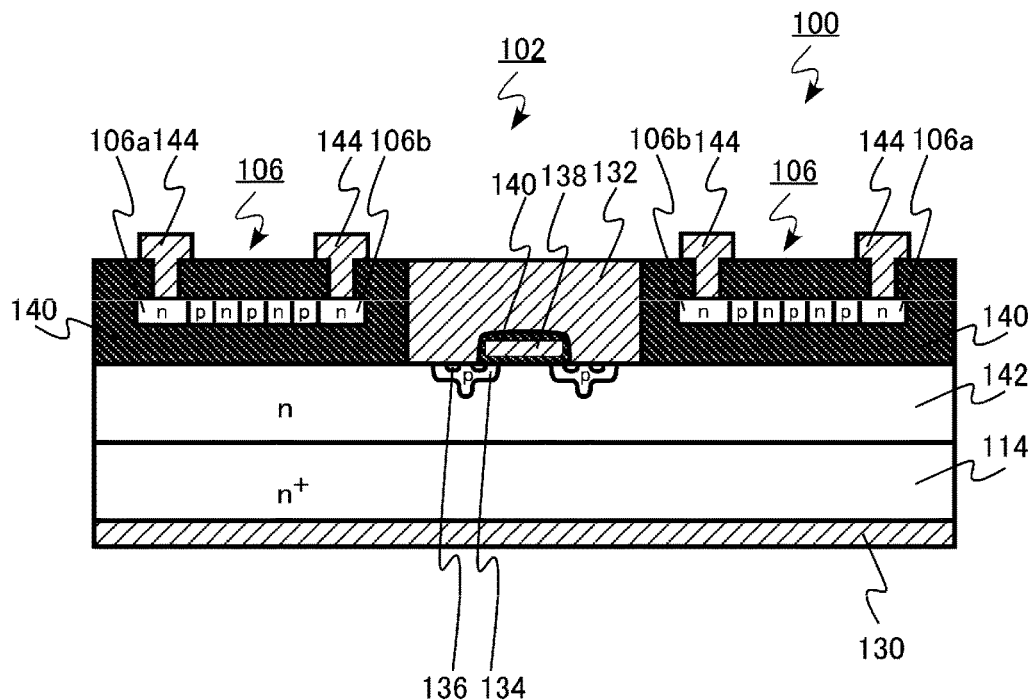
FIGS. 3A and 3B are schematic sectional diagrams illustrating portions of the internal configuration of the semiconductor device according to the embodiment.
Figure 3B:
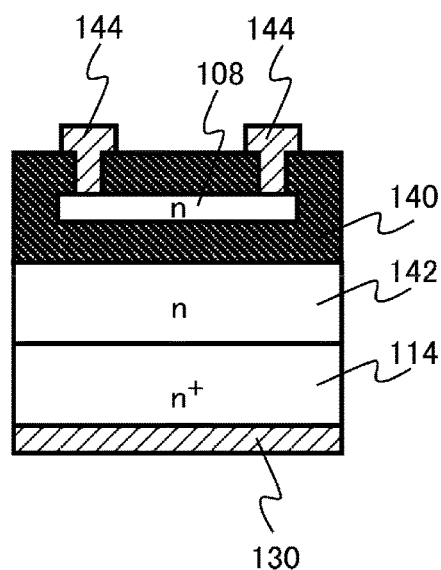

FIG. 2 is a schematic diagram illustrating the semiconductor device 100 according to the embodiment. FIGS. 3A and 3B are schematic diagrams illustrating the main sections of the internal structure of the semiconductor device 100 according to the embodiment. FIG. 3A is a schematic diagram illustrating the internal structure of the first bidirectional diode 106 and the semiconductor element 102 of the semiconductor device 100 according to the embodiment shown in section along line A-A' of FIG. 2. FIG. 3B is a schematic diagram illustrating the internal structure of the first resistor element 108 of the semiconductor device 100 according to the embodiment.

A substrate 114 is, for example, a silicon (Si) substrate which contains n-type impurities.

The first bidirectional diode 106 is provided having a ring shape within an insulating layer 140 which is provided on the substrate 114. Here, the ring shape is, for example, a square form. However, the ring shape may be, for example, a circular shape or the like. The first bidirectional diode 106 includes a first connection section 106a and a second connection section 106b which is provided on an inner side than the first connection section 106a. Portions which contain the n-type impurities and portions which contain the p-type impurities are alternately provided between the first connection section 106a and the second connection section 106b. Both the portions which contain the n-type impurities and the portions which contain the p-type impurities have the ring shapes. The wirings 144 are electrically connected to the semiconductor element 102 and the first resistor element 108 and are formed of, for example, Aluminum (Al), are electrically connected to the first connection section 106a and the second connection section 106b, respectively.

The semiconductor element 102 is provided within the perimeter of the ring shaped first bidirectional diode 106. The semiconductor element 102 includes a drift layer 142 which is provided on the substrate 114 and contains n-type impurities, a first semiconductor element electrode 130 which is provided on the substrate 114 on a side opposite to the drift layer 142, a well region 134 which is provided in the drift layer 142 and which contains p-type impurities, a source area 136 which is provided in the well region 134 and contains the n-type impurities, a control electrode 138 which is provided on the drift layer 142, an insulating layer 140 which is provided in the vicinity of the control electrode 138 on the drift layer 142, and a second semiconductor element electrode 132 which is provided on the source area 136.

The second bidirectional diode 112 is provided adjacent to the semiconductor element 102 within the perimeter of the ring shaped first bidirectional diode 106. The second bidirectional diode 112 may be a ring-shaped diode, in which both the portions which contain the n-type impurities and the portions which contain the p-type impurities have ring shapes similarly to the first bidirectional diode 106 as illustrated in FIG. 3A. In addition, a semiconductor layer which contains the n-type impurities and a semiconductor layer which contains the p-type impurities may be alternately stacked on the substrate 114 in the vertical direction. Meanwhile, although not illustrated in the drawing, a gate pad to which a gate control signal is input is provided, for example, on the second bidirectional diode 112.

The first resistor element 108 and the second resistor element 110 are formed of a semiconductor material which is provided in the insulating layer 140 and contains impurities. The wirings 144, which are used to electrically connect the bidirectional diode and the semiconductor element 102 together contain, for example, Al, are provided at both ends of each of the first resistor element 108 and the second resistor element 110. Meanwhile, although the first resistor element 108 contains n-type impurities in the FIG. 3B, the first resistor element 108 may contain p-type impurities.

Meanwhile, it is possible to preferably perform electrical connection between the semiconductor element 102, the first bidirectional diode 106, the first resistor element 108, the second resistor element 110, and the second bidirectional diode 112 using a well-known electrical connection method in addition to the method described in the disclosure.

It is preferable that the first resistor element 108 or the second resistor element 110 is provided adjacent to the second bidirectional diode 112 within the perimeter of the ring shaped first bidirectional diode 106.

Since it is easy to form the first bidirectional diode 106, the second bidirectional diode 112, the first resistor element 108, and the second resistor element 110 using polysilicon, it is preferable to use polysilicon for these device elements. It is also possible to use a well-known semiconductor material such as amorphous silicon or single crystal silicon in place of polysilicon.

It is preferable that the impurities which are contained in the first polysilicon of the first resistor element 108 and the impurities which are contained in the second polysilicon of the second resistor element 110 are the same type and have an equivalent concentration. Here, the equivalent concentration means that the concentration of the impurities contained in the first polysilicon is equal to the concentration of the impurities contained in the second polysilicon, within a manufacturing tolerance range. In addition, it is possible to evaluate the concentration of the impurities in the semiconductor device 100 according to the embodiment by, for example, Secondary Ion Mass Spectrometry (SIMS).

Subsequently, the operational effect of the embodiment will be described.

Figure 4:
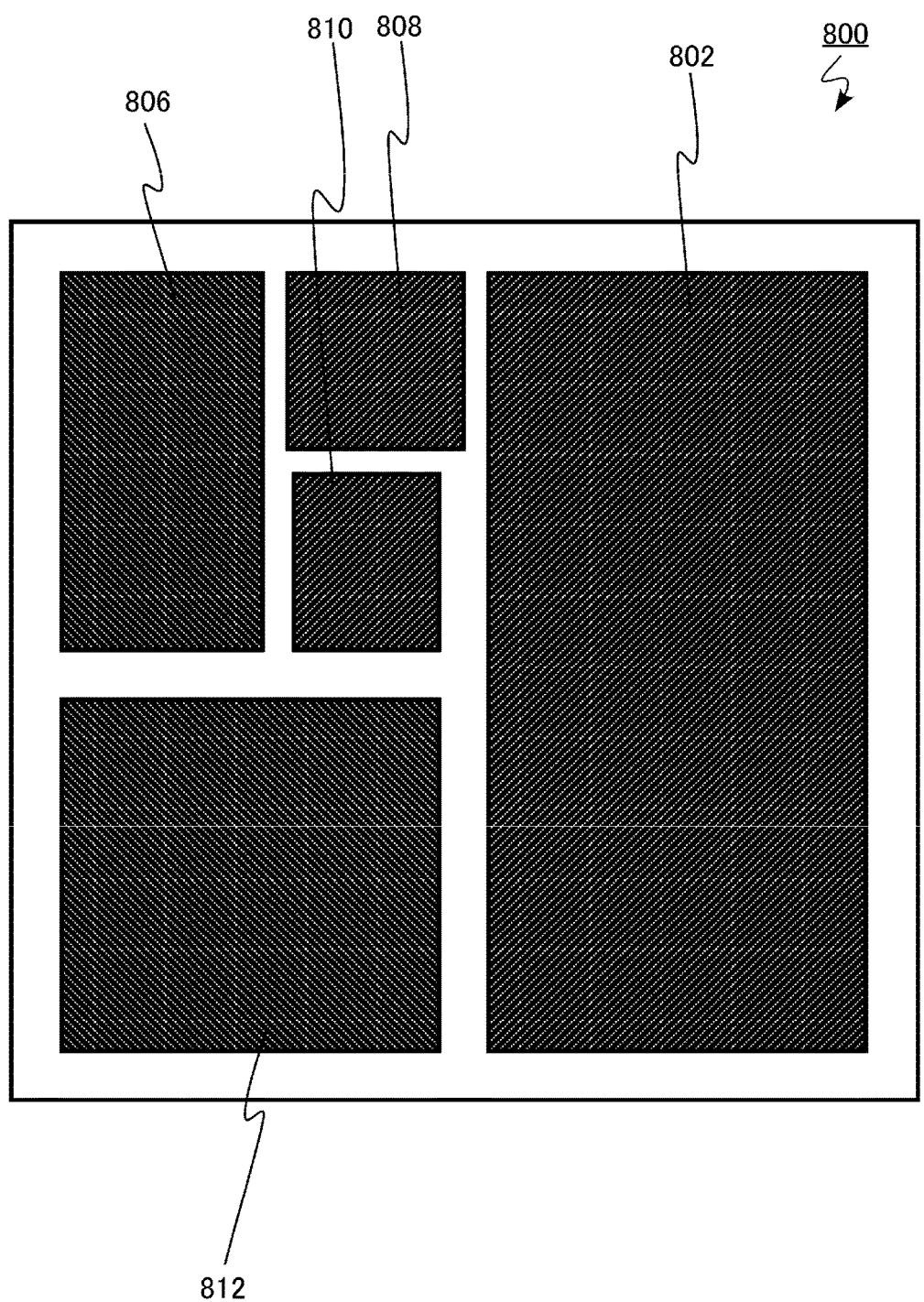
FIG. 4 is a schematic diagram illustrating a semiconductor device which is a comparative example.

FIG. 4 is a schematic diagram illustrating a semiconductor device 800 according to a comparative example of the embodiment. The semiconductor device 800 includes a semiconductor element 802, a first bidirectional diode 806, a first resistor element 808, a second resistor element 810, and a second bidirectional diode 812. The first bidirectional diode 806 is provided in the vicinity of the semiconductor element 802.

In order to achieve a high avalanche resistance and high inter-drain-source ESD resistance for the first bidirectional diode, it is preferable to increase the cross-sectional area in a junction section, such as a PN junction section, of the diode.

In order to satisfy the above-described condition and reduce the size of the semiconductor device 100, it is preferable that the first bidirectional diode 106 is formed in the ring shape and that the semiconductor element 102 and the second bidirectional diode 112 are provided within the circumference of the ring shaped first bidirectional diode 106. In a case in which the first bidirectional diode 106 is formed in the ring shape, it is possible to increase the peripheral length of the diode while reducing the size of the semiconductor device 100, and thus it is possible to increase the cross-sectional area in the junction section.

In contrast, in the n-type vertical MOSFET, the first semiconductor element electrode 130 is generally provided on the side of the substrate 114 which is opposite to the drift layer 142, that is, on the back surface of the substrate 114. Further, there is a case in which the first semiconductor element electrode 130 is provided by being extended to the side of the substrate 114. Here, the semiconductor device 100 according to the embodiment is provided with the first connection section 106*a*, and the second connection section 106*b* which is provided to the inner side of the first connection section 106*a*. Therefore, through the wirings 144, the back surface and the sides of the substrate 114 are easily electrically connected to the first connection section 106*a* while reducing the size thereof and, further, it is possible to easily electrically connect the external electric circuit L to the first semiconductor element electrode 130. In addition, it is possible to easily electrically connect the second connection section 106*b* to the control electrode 138.

In a case in which the first resistor element 108 or the second resistor element 110 are provided within the perimeter of the ring shaped first bidirectional diode 106, it is possible to further reduce the size of the semiconductor device 100. In particular, when the gate pad is provided on the second bidirectional diode, the first resistor element 108 and the second resistor element 110 are used to stabilize the gate voltage. Therefore, it is preferable to provide the first resistor element 108 and the second resistor element 110 in the vicinity of the second bidirectional diode 112 rather than an area which is near to the semiconductor element 102 because it is possible to easily perform the electrical connection to the gate pad. In addition, it is easy to manufacture the semiconductor device 100 in a case of individually dividing the area in which the semiconductor element 102 is formed from the area in which the protection elements, such as the diodes and the resistors, are formed. From this point of view, it is preferable to provide the first resistor element 108 and the second resistor element 110 adjacent to the second bidirectional diode 112.

It is possible to easily form the first bidirectional diode 106, the second bidirectional diode 112, the first resistor element 108, and the second resistor element 110 because the diodes and elements are formed of polysilicon and contain polysilicon.

When the diodes are formed of polysilicon, it is difficult to form the polysilicon on the substrate to be thick, and thus it is difficult to form the cross-sectional area to be thick. From this point of view, it is preferable to form the first bidirectional diode 106 and the second bidirectional diode 112 in the ring shape, thereby increasing their cross-sectional areas.

In a case in which the impurities which are contained in the first polysilicon of the first resistor element 108 and the impurities which are contained in the second polysilicon of the second resistor element 110 have the same type and have the equivalent concentration, it is possible to reduce the number of processes, such as ion implantation, and thus it is possible to easily manufacture the semiconductor device 100.

According to the semiconductor device according to the embodiment, it is possible to provide the semiconductor device in which the size is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first bidirectional diode of a ring shape surrounding a central region, and including a first connection section on an outer edge of the ring shape and a second connection section on an inner edge of the ring shape and outside the central region;
a semiconductor element in the central region and including a first semiconductor element electrode, a second semiconductor element electrode, and a control electrode, the first semiconductor element electrode electrically connected to the first connection section, and the second semiconductor element electrode electrically connected to the control electrode;
a first resistor element in the central region and including a first resistor electrode and a second resistor electrode, the first resistor electrode electrically connected to the second connection section and the control electrode;
a second bidirectional diode in the central region and including a first side electrode electrically connected to the second resistor electrode and a second side electrode electrically connected to the second semiconductor element electrode; and
a second resistor element electrically connected to the second resistor electrode.

2. The device according to claim 1,
wherein the first bidirectional diode, the second bidirectional diode, the first resistor element, and the second resistor element comprise polysilicon.

3. The device according to claim 2,
wherein n-type or p-type impurities contained in the polysilicon of the first resistor element and n-type or p-type impurities contained in the polysilicon of the second resistor element are of the same type and have the same concentration.

4. The device according to claim 1, wherein the second resistor electrode overlies the control electrode and is spaced therefrom by an insulating layer.

5. The device according to claim 1, wherein the semiconductor element further comprises an n-type drift layer on a substrate, a p-type well region on the n-type drift layer, and an n-type source area in the p-type well region, wherein the control electrode is over the n-type drift layer.

6. A semiconductor device, comprising
a substrate containing a first type impurity;
a first semiconductor layer on the substrate, the first semiconductor layer containing the first type impurity at a lower concentration than the impurity concentration in the substrate;
a well region in the first semiconductor layer, the well region containing a second type impurity;
a second semiconductor layer in the well region and containing the first type impurity;
an insulating layer on the first semiconductor layer;
a first bidirectional diode within the insulating layer, the first bidirectional diode having a ring shape surrounding a central region of the insulating layer;
a first resistor in the central region;
a second resistor in the central region of the insulating layer;
a control electrode disposed above the well region and the first semiconductor layer within a region surrounded by the first bidirectional diode; and
a second bidirectional diode having a first end electrically connected to the control electrode and an end of the first resistor, a second end of the second bidirectional diode being electrically connected to the second semiconductor layer.

7. The device according to claim 6, further comprising:
a first diode wiring electrically connected to the first bidirectional diode and a second diode wiring electrically connected to the first bidirectional diode; and
a first resistor electrode and a second resistor electrode, the first resistor electrode electrically connected to the second diode wiring and to the control electrode.

8. The device according to claim 6, wherein the first bidirectional diode, the second bidirectional diode, the first resistor, and the second resistor comprise polysilicon.

9. The device according to claim 8,
wherein n-type or p-type impurities contained in the polysilicon of the first resistor and n-type or p-type impurities contained in the polysilicon of the second resistor are the of same type and at the same concentration.

10. The device according to claim 6, wherein the second bidirectional diode is in the central region.

11. The device according to claim 10, wherein at least one of the first resistor and the second resistor are adjacent to the second bidirectional diode.

* * * * *